United States Patent [19]

Berman

[11] Patent Number: 4,798,808

[45] Date of Patent: Jan. 17, 1989

[54] PHOTOCONDUCTIVE DEVICE COONTAINING ELECTROLESS METAL DEPOSITED CONDUCTIVE LAYER

[75] Inventor: Elliot Berman, Los Angeles, Calif.

[73] Assignee: Atlantic Richfield Company, Los Angeles, Calif.

[21] Appl. No.: 838,737

[22] Filed: Mar. 11, 1986

[51] Int. Cl.$^4$ .................... H01L 31/18; H01L 21/288
[52] U.S. Cl. ......................... 437/4; 136/256; 136/258; 437/187; 437/230
[58] Field of Search ........... 136/256, 258 AM; 357/2, 357/30, 59 C, 65; 427/74, 86, 88, 92; 29/572, 589; 148/33.3; 428/620; 437/2-5, 187, 230

[56] References Cited

U.S. PATENT DOCUMENTS

| 4,472,458 | 9/1984 | Sirinyan et al. | 427/92 |
| 4,568,791 | 2/1986 | Kawai | 136/256 |
| 4,626,322 | 12/1986 | Switzer | 204/2.1 |

FOREIGN PATENT DOCUMENTS 56-94677  7/1981  Japan ..................... 136/258 AM
58-23433  2/1983  Japan .

OTHER PUBLICATIONS

A. Ricaud et al, *Proceedings, 6th E. C. Photovoltaic Solar Energy Conf.* (1985) pp. 1056–1059.
N. R. Saha et al, *Indian J. Phys.*, vol. 54A, pp. 258–263, May 1980.

*Primary Examiner*—Aaron Weisstuch
*Attorney, Agent, or Firm*—Nilsson, Robbins, Dalgarn, Berliner, Carson & Wurst

[57] ABSTRACT

A photoconductive device having an electroless metal deposited conductive layer is provided. The conductive layer is deposited upon n+Si:H alloy. The electroless metal deposited layer can be used as the back contact of a solar cell or as a metal contact for other types of photoconductive devices.

3 Claims, 1 Drawing Sheet

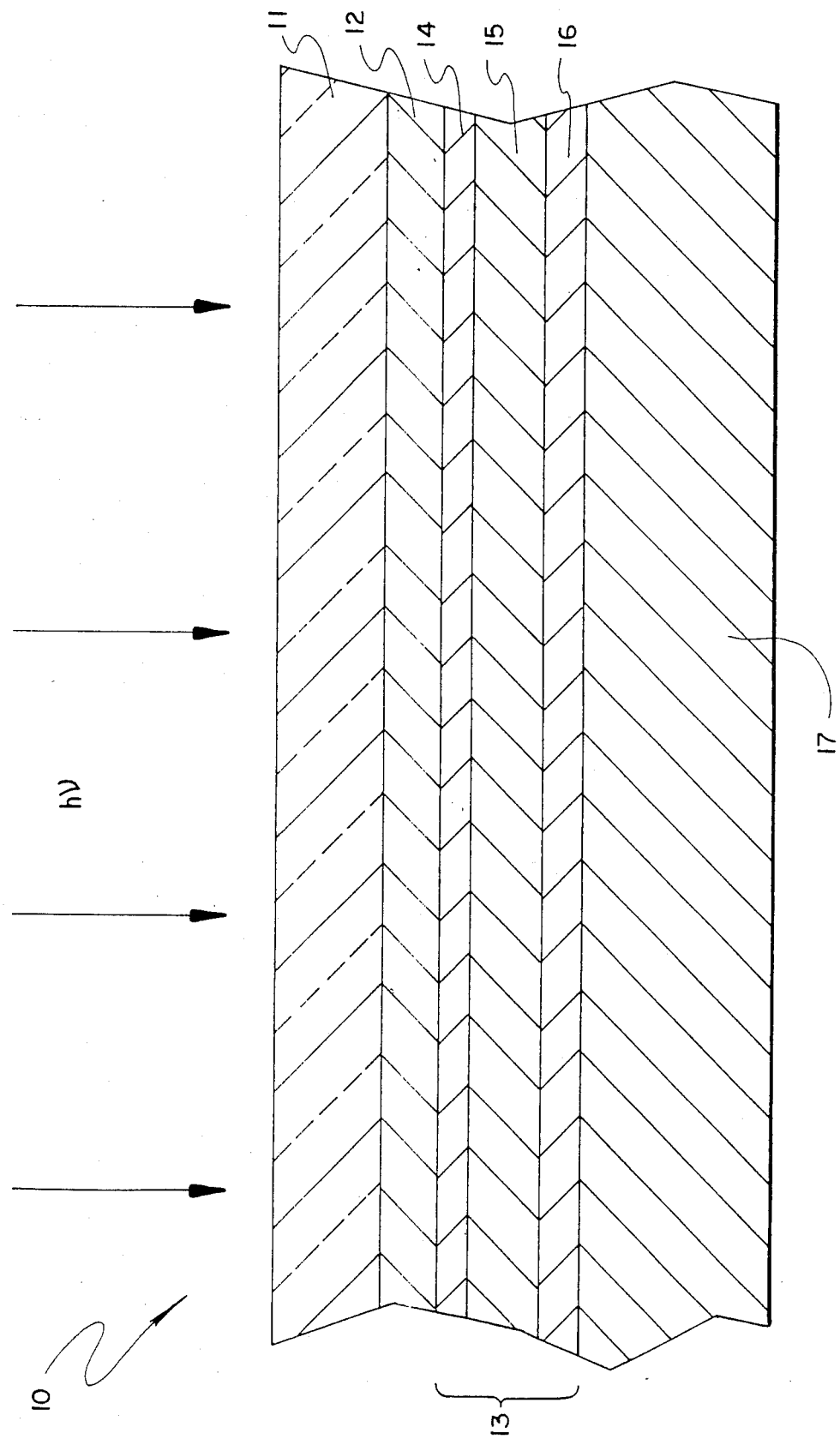

PHOTOCONDUCTIVE DEVICE COONTAINING ELECTROLESS METAL DEPOSITED CONDUCTIVE LAYER

BACKGROUND OF THE INVENTION

The present invention relates generally to the art of photoconductive devices such as solar cells for converting light into electrical energy and, more particularly, to a photoconductive device containing an electroless metal deposited conductive layer.

Photoconductive devices generally consist of a photoconductor capable of generating an electrical potential upon being exposed to light and contacts which are effective to draw off any electric current which results from irradiation of the photoconductor. In most instances, such photoconductive devices also contain a suitable substrate such as glass, in order to provide protection from the environment and to serve as a base for the photoconductor.

Many different photoconductive materials are known, such as silicon, germanium, gallium arsenide, and copper indium diselenide, to name but a few. Photoconductors comprising silicon have obtained particularly wide usage because of their economy. Originally, single crystal silicon photoconductors were widely used. However, recently, thin film alloys of silicon and hydrogen (TFS) have come to be preferred because of their lower cost and ease of fabrication. In particular, TFS layers incorporating a P-layer, an I-layer, and an N-layer, known as P-I-N photoconductors, have been utilized. The I-layer, the intrinsic layer, is generally formed from a thin layer of microcrystalline or amorphous silicon alloyed with hydrogen or a silicon hydride. The P-layer is formed from silicon doped with boron or similar dopant. Positive charge carriers, known as holes, are predominant in the P-layer. The N-layer is formed from silicon doped with phosphorous or similar dopant. Electrons are predominant in the N-layer.

Contacts on the P-layer and the N-layer permit electric current to be drawn off into an external circuit for use therein. More recently, such contacts have taken the form of thin films, such as films of tin oxide, indium tin oxide, or other transparent conductive oxide. The use of zinc oxide films, for example, is disclosed in copending application of Steven C. Lewis et al., Ser. No. 740,945, filed June 4, 1985, now U.S. Pat. No. 4,623,601, assigned to the same assignee as the present invention. Such conductive oxides are relatively transparent in reasonable thicknesses. They have been used primarily as the front contact in solar cells, that is, the contact adjacent to the transparent substrate, which may face or be distant from the incoming light rays, since transparency is not a major consideration in the case of the back contact. Metals, on the other hand, are transparent to light rays only when applied in extremely thin layers. They have therefore been used mainly as the back contact in solar cells. The back contact generally has been fabricated from such metals as aluminum, silver, molybdenum, titanium, or nickel.

In efforts to reduce the cost and improve the electrical efficiency of photoconductive devices, several different techniques for the deposition of the various layers comprising such devices have been explored. For example, the deposition of zinc oxide films by a chemical vapor deposition process is disclosed in copending application of Pantham I. Vijayakumar et al., Ser. No. 741,081, filed June 4, 1985, assigned to the same assignee as the present invention. Aluminum and other metals have been sputtered upon the photoconductor to form the back contact in TFS photoconductive devices. However, sputtering involves the use of relatively high temperatures, which may have adverse effects upon photoconductors. Sputtering also results in the deposition of somewhat non-uniform films. In addition, sputtering is slow, difficult to control and involves the use of relatively expensive equipment.

It is accordingly an object of the present invention to provide a photoconductive device having good electrical efficiency at lower cost.

It is another object of this invention to provide such a device which contains a conductive metal film uniformly deposited upon a photoconductor.

Another object of this invention is to provide a method for depositing such conductive metal films in a facile manner.

Other objectives and advantages of the present invention will become apparent from the following detailed description.

SUMMARY OF THE INVENTION

The photoconductive device of the present invention utilizes an electroless metal deposited layer applied to an n+Si:H alloy. The n+Si:H alloy constitutes the N-layer of a photoconductor and the electroless metal deposited layer constitutes a contact for the photoconductor. The resulting photoconductive device, which contains a uniformly deposited conductive metallic film, displays good electrical efficiency compared to that of devices in which the conductive metallic layer is deposited by sputtering or other previously used methods and has a lower cost.

BRIEF DESCRIPTION OF THE DRAWINGS

The sole FIGURE of the drawings is an enlarged, fragmentary cross-sectional schematic view of a photoconductive device according to the present invention.

DESCRIPTION OF THE PREFERRED EMBODIMENTS

In general, the present invention relates to photoconductive devices in which a metallic conductive layer formed by electroless metal deposition is used as a contact layer for the photoconductor. The electroless metal deposited layer can, for example, serve as the back contact for a solar cell in which the back contact is opaque, or as a contact for other types of photoconductive devices.

Turning now to the drawing, the invention is exemplified by a photoconductive device 10 which consists of a substrate 11, a transparent conductive layer 12 and a series of layers comprising a TFS layer 13. The TFS layer 13 consists of a P-layer 14, an I-layer 15 and an N-layer 16. Adjacent N-layer 16 is a conductive layer 17.

The substrate 11 can be any transparent insulating material such as glass or a suitable transparent plastic material. Glass is frequently used because of its strength and desirable optical properties.

The transparent conductive layer 12 can be any conductive oxide, for example, zinc oxide, tin oxide or indium tin oxide. In a preferred embodiment, the transparent conductive layer is zinc oxide containing certain additives. Such additives as hydrogen or a group III element such as boron, aluminum, gallium, indium, or thallium can be used, depending upon the resistivity and thermal properties desired. For example, zinc oxide containing hydrogen is less thermally stable than is zinc oxide containing aluminum, while zinc oxide containing aluminum has a somewhat higher resistivity than does zinc oxide containing hydrogen. Trace amounts of the additives are used, as will be pointed out more in detail below. The thickness of the transparent conductive layer can be about 100–60,000 angstroms.

The photoconductor 13 is shown as comprising three layers of semiconductive materials, namely, a P-layer, an I-layer and an N-layer. However, if desired, it is sufficient to provide a P-layer and an N-layer or to use a single layer in which a concentration gradient of dopant results in contributing P character and N character to various parts of the layer.

In a preferred embodiment, P-layer 14 comprises a hydrogenated silicon-carbon alloy which is doped with boron. In this preferred embodiment, the P-layer can contain about 60 to 70 atomic percent silicon, about 20 atomic percent carbon, about 10 to 20 atomic percent hydrogen and a fraction of an atomic percent boron as a dopant. The thickness of the P-layer can vary between about 70 and 300 angstroms.

The I-layer is composed of a silicon-hydrogen alloy which can contain about 85 to 95 atomic percent silicon and about 5–15 atomic percent hydrogen. The I-layer can be about 2500 to 7500 angstroms in thickness.

The N-layer is composed of amorphous silicon containing phosphorous. This layer can contain about 85 to 95 atomic percent silicon, about 5–15 atomic percent hydrogen and a fraction of an atomic percent to a few atomic percent of phosphorous. The thickness of the N-layer can be between about 200 and 800 angstroms.

The back contact 17 is an electroless deposited metal such as nickel, silver, aluminum, titanium, or molybdenum. Electroless deposited nickel is preferred. The thickness of the back contact can be about 1000–5000 angstroms.

The photoconductive and transparent conductive layers can be deposited upon the substrate by means of a glow discharge technique, sputtering, or chemical vapor deposition. For example, a 100–60,000 angstroms layer of indium tin oxide can be applied to a glass substrate by means of magnetron sputtering at low temperatures, for example, temperatures in the range of about 25–250 degrees Celsius, or at higher temperatures of up to about 500 degrees Celsius if desired. Inclusion of selected additives is accomplished by use of a metallic target or by bleeding hydrogen or other gaseous additive into the argon stream used in sputtering. Alternatively, tin oxide coated glass, which is commercially available, can be used.

In a preferred embodiment the transparent conductive layer is a wide band-gap zinc oxide layer which is transparent at wavelengths in the visible range from 300 to 1300 nm. Zinc oxide can be readily deposited upon the glass substrate by sputtering to provide a transparent layer having a thickness in the range of about 100–60,000 angstroms at a pressure in the range of about 5 to 20 millitorr and at a temperature in the range of about 25–250 degrees Celsius with about 2,000–15,000 angstroms being preferred. Where hydrogen inclusion is desired, the hydrogen pressure should be in the range of about 0.01 to 0.08 millitorr with 0.04 millitorr preferred. Where aluminum inclusion is desired, the aluminum content should be in the range of about 0.2–10 percent by weight with about 0.5–5 weight percent preferred. The resulting transparent conductive layer is highly conductive, having a resistivity in the range of about $10^{-4}$ to $10^{-2}$ ohm-centimeter. Where the zinc oxide contains hydrogen, the resulting ZnO:H layer, which can be deposited at a temperature of about 25 to 90 degrees Celsius, has been found to have a resistivity in the range of about $6\times10^{-4}$ to $1\times10^{-3}$ ohm-centimeter. A zinc oxide layer containing aluminum can be deposited at somewhat higher temperatures as well as at room temperature depending upon the method used. The ZnO:Al layer has a resistivity of about $8\times10^{-4}$ to $1\times10^{-3}$ ohm-centimeter. It is also possible to include both hydrogen and aluminum in the zinc oxide. Hydrogen pressures in the range of about 0.01 to 0.08 millitorr and an aluminum content in the range of about 0.20 to 10 weight percent are suitable. A hydrogen pressure of about 0.04 millitorr and an aluminum content of about 0.5 to 5 weight percent are preferred. The ZnO:H:Al layer displays a resistivity in the range of about $3\times10^{-4}$ to $6\times10^{-4}$ ohm-centimeter. Alternatively, the zinc oxide layer can be applied by chemical vapor deposition as described in the copending application of Pantham I. Vijayakumar et al., Ser. No. 741,081, filed June 4, 1985, assigned to the same assignee as the present invention.

Following deposition of the transparent conductive layer, the TFS photoconductor is deposited in several steps. The P-layer can be readily formed by introducing a mixture of silane, methane, and diborane into a glow discharge chamber in proportions to give the desired P-layer composition. Deposition upon the transparent conductive layer occurs at a pressure of about 0.1–1.0 torr and at a temperature of about 150–300 degrees Celsius. Deposition is continued for a sufficient period of time to deposit a layer of the desired thickness. A P-layer having a band-gap between about 1.9 and 2.0 eV, a dark conductivity of about $10^{-6}$ inverse ohm-centimeter and a light conductivity of about $10^{-5}$ inverse ohm-centimeter can be obtained in this manner. After the P-layer is deposited, the glow discharge chamber is purged to avoid any contamination of the I-layer, which is deposited next.

Deposition of the I-layer is then accomplished by evacuating the chamber and back-filling with pure silane gas. Deposition then proceeds at a pressure of about 0.1–1.0 torr and a temperature of about 150–300 degrees Celsius. Following deposition of the I-layer, the chamber is pumped down and back-filled for deposition of the N-layer.

In order to deposit the desired silicon and phosphorous composition comprising the N-layer, silane and a mixture of phosphine in an inert gas are passed through the chamber at a pressure of about 0.1–1.0 torr and a temperature of about 150–300 degrees Celsius.

The final step in the fabrication is the deposition of the back contact layer. The back contact can be applied, in accordance with the present invention, by electroless plating of nickel or other metal on the N-layer of the TFS photoconductor. Such electroless plating is readily accomplished by using an electroless plating solution maintained at a slightly alkaline pH and moderately heating the plating bath while immersing the partially fabricated solar cell into the bath. Immersion for a period of time within the range of about 1–10 minutes is generally sufficient to provide a nickel layer of the desired thickness upon the n+Si:H alloy comprising the N-layer of the TFS photoconductor without depositing nickel upon the glass substrate. A pH in the range of about pH 7.5–8.5 is satisfactory, the pH being maintained by the addition of ammonium hydroxide to the plating bath. Temperatures in the range of about 80 degrees to 95 degrees Celsius and preferably about 90 degrees Celsius are effective to produce the desired deposition of nickel upon the photoconductor. If desired, the electroless plating solution can be applied by spraying rather than immersing.

Electroless plating solutions are well known. In general such baths comprise a solution of a metal salt and a chemical reducing agent. Electroless plating baths may also contain a complexing agent such as citric acid or an ethylenediaminetetraacetic acid (EDTA) as well as other adjuvants. The reducing agent in the case of a nickel plating bath is an alkali metal hypophosphite. A suitable metal salt is nickel chloride. Whereas most nonconductors require the use of a catalyst for coating the surfaces thereof, it has been found that no catalyst is necessary in the case of the n+Si:H alloy comprising the N-layer of the P-I-N photoconductor. Apparently, the n+Si:H alloy is itself an effective catalyst for the deposition of nickel. Electroless plating baths are commercially available. One particularly suitable electroless nickel plating solution is that marketed as Electroless Nickel Plating Solution 139-500011-71 by J. E. Halma Company, Inc., of Lodi, N.J.

Other metals than nickel, such as silver, aluminum, titanium, or molybdenum could also be used if desired. Nickel, however, is preferred because of the facile manner in which nickel can be deposited upon n+Si:H alloy by electroless metal deposition.

Following immersion in the electroless plating solution for the appropriate length of time, the plated photoconductor or partially fabricated solar cell is removed from the bath, rinsed in distilled water, and immediately blow-dried to avoid surface oxidation. Laser scribing and shunt fixing, as well as annealing, are optional process steps which can be performed if desired.

The following example illustrates the electroless deposition of nickel upon a partially fabricated solar cell containing a TFS photoconductor deposited upon a tin oxide coated glass substrate.

EXAMPLE

An electroless nickel plating bath (Electroless Nickel Plating Solution 139-500011-71, J. E. Halma Company, Inc., Lodi, N.J.) was adjusted to pH 8 by the addition of NH$_4$OH, heated to 90 degrees Celsius and stirred with a magnetic stirrer. A 100 square centimeter Glass/TO/TFS substrate was mounted into a plastic holder, rinsed with distilled water, and immersed into the stirred bath for 3 minutes. The resulting plated solar cell was removed from the bath, rinsed in distilled water and blow-dried. Prior to testing, the solar cell was laser scribed, shunt-fixed, and annealed at 175 degrees Celsius for 15 minutes. The resulting nickel film was found to be 2000 angstroms thick and to have a surface resistivity of 3.3 ohms per square. A 5000 angstrom nickel film similarly deposited in 8 minutes developed a surface resistivity of 0.6 ohm per square. Solar cell efficiencies of 4 and 6 percent, respectively, were determined upon testing.

In general, the solar cells fabricated according to the present invention, having an electroless nickel deposited back layer, have been found to have a surface resistivity in the range of about 0.6 ohm per square to 10.5 ohms per square. Electrical efficiencies of about 4 percent to over 6 percent have been realized.

While certain specific embodiments of the invention have been disclosed as typical, the invention is, of course, not limited to these particular forms, but rather is applicable to all such variations as fall within the scope of the appended claims. For example, electroless metal deposited conductive layers are useful in a wide variety of photoconductive devices in addition to solar cells. In the case of solar cells, other configurations than that using the exemplified P-I-N photoconductor can be utilized in the present invention.

What is claimed is:

1. A process for the production of a photoconductive device which comprises:
    applying a transparent conductive layer to a transparent insulating substrate;
    applying a thin film silicon hydrogen alloy (TFS) photoconductor, the N layer of which comprises n+Si:H alloy, to said transparent conductive layer; and
    applying a conductive metal layer to said N layer by immersing the resulting TFS photoconductor applied to a transparent conductive layer applied to a transparent insulating substrate in an electroless metal plating bath maintained at a pH in the range of about pH 7.5 to pH 8.5 at a temperature of about 80° to 95° Celsius for about 1 to 10 minutes, said n+Si:H alloy catalyzing the deposition of an electroless metal deposited film, and removing from said bath a photoconductive device containing a TFS photoconductor having a layer of metal of about 1,000 to 5,000 angstroms in thickness plated only upon said n+Si:H alloy.

2. A process according to claim 1 wherein said photoconductor is a P-I-N photoconductor.

3. A process according to claim 1 wherein said conductive metal layer is nickel.

* * * * *